(12) United States Patent
Kim

(10) Patent No.: US 9,141,001 B2
(45) Date of Patent: Sep. 22, 2015

(54) MASK SUPPORT FRAME AND MASK ASSEMBLY HAVING THE SAME

(71) Applicant: Samsung Display Co., Ltd., Yongin, Gyeonnggi-Do (KR)

(72) Inventor: Yong-Hwan Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 253 days.

(21) Appl. No.: 13/786,863

(22) Filed: Mar. 6, 2013

(65) Prior Publication Data

US 2013/0314686 A1 Nov. 28, 2013

(30) Foreign Application Priority Data

May 24, 2012 (KR) ........................ 10-2012-0055495

(51) Int. Cl.
  *B05C 21/00* (2006.01)
  *B05C 11/00* (2006.01)
  *G03F 7/20* (2006.01)
(52) U.S. Cl.
  CPC ................................ *G03F 7/70733* (2013.01)

(58) Field of Classification Search
  None
  See application file for complete search history.

(56) References Cited

U.S. PATENT DOCUMENTS

2011/0146573 A1* 6/2011 Park .............................. 118/712

FOREIGN PATENT DOCUMENTS

| KR | 10-2002-0000085 A | 4/2002 |
| KR | 10-2009-0052203 A | 5/2009 |
| KR | 10-0941311 A | 10/2009 |
| KR | 10-2009-0123590 A | 12/2009 |
| KR | 10-1107159 A | 6/2011 |

* cited by examiner

*Primary Examiner* — Charles Capozzi
(74) *Attorney, Agent, or Firm* — Knobbe, Martens, Olson & Bear LLP

(57) ABSTRACT

A mask support frame for supporting a mask is provided. The frame is configured to secure both ends of a mask and apply tension to the mask in a first direction. The frame includes a frame main body defining an opening for exposing a patterned opening area of the mask and an end tensioner coupled to the frame main body, and configured to apply tension to one of both ends of the mask in a second direction crossing the first direction.

9 Claims, 5 Drawing Sheets

MASK SUPPORT FRAME AND MASK ASSEMBLY HAVING THE SAME

RELATED APPLICATIONS

This application claims priority to and the benefit of Korean Patent Application No. 10-2012-0055495 filed in the Korean Intellectual Property Office on May 24, 2012, the entire contents of which are incorporated herein by reference.

BACKGROUND

1. Field

The present disclosure relates generally to a mask support frame and a mask assembly including the mask. More particularly, the present disclosure relates generally to a frame for supporting a mask for depositing an organic emission layer.

2. Discussion of the Related Technology

Display devices are widely used to display images in electronic devices. Recently, organic light emitting diode (OLED) displays have become popular.

Unlike a liquid crystal display (LCD), the OLED has the characteristic of self-emission and does not require an extra light source, so the thickness and weight of the display device can be reduced. The OLED exhibits high quality characteristics such as low power consumption, high luminance, and a high response speed.

In order to manufacture the OLED display, an electrode with a particular pattern, an organic emission layer, and the like are formed, and a deposition method using a mask assembly may be employed.

In further detail, the organic light emitting display includes pixels arrayed in a matrix form. For forming pixels, an organic light emitting diode that has an anode electrode and a cathode electrode is formed, with organic emission layer emitting light such as red, green, or blue, etc., for each pixel between the electrodes. Organic materials forming the organic emission layer are very vulnerable to moisture, oxygen, etc., such that they are isolated from moisture during a process of forming the organic emission layer and after forming the organic emission layer. Therefore, it is difficult to form patterns of organic light emitting material by using a general photolithography process. Therefore, the organic emission layer is formed by using a mask having patterned openings for allowing deposition materials to pass therethrough. When in use, the mask is attached to and supported by a mask support frame.

The above information disclosed in this background section is only for enhancement of understanding of the background of the described technology and therefore it may contain information that does not form the prior art that is already known in this country to a person of ordinary skill in the art.

SUMMARY

One aspect provides a mask support frame for avoiding a wave in a width direction of a mask generated by a tensile force applied in a length direction of the mask.

An embodiment provides a mask support frame for supporting a mask, the frame being configured to secure both ends of a mask and apply tension to the mask in a first direction, the frame including: a frame main body defining an opening for exposing a patterned opening area of the mask; and an end tensioner coupled to the frame main body, and configured to apply tension to one of both ends of the mask in a second direction crossing the first direction.

The frame is configured to secure additional multiple masks such that the masks are disposed side by side and arranged in the second direction. Each of both ends of the mask comprises a central area and two peripheral areas arranged in the second direction such that the central area is interposed between the peripheral areas, wherein the central area is configured to be attached to a mask seat of the frame main body, wherein one of the peripheral areas is configured to be attached to the end tensioner.

The frame main body includes mask seats, each of which is configured to couple to an end of one of the masks, and a depression provided between the mask seats, and the end tensioner is provided in the groove.

The frame main body comprises a slide guide formed in the depression and extending in the second direction; and the end tensioner includes a slider engaged with the slide guide, configured to slide in the second direction, and further configured to be coupled to the mask.

The frame further includes a separation preventing shaft extending through the slider and connected to the frame main body.

The frame further includes a tension adjustor configured to adjust the amount of tension in the second direction.

The tension adjustor includes: a first rack coupled to the frame main body, extending in the second direction, and having first teeth therein; a second rack coupled to the slider, opposing the first rack, and including second teeth; a pinion engaged with the first and second teeth and located between the first and second teeth; and a rotation shaft fixed to the pinion and protruding outside the frame main body.

Another embodiment provides a mask assembly including the foregoing frame; and at least one mask with both ends secured with the frame with tension applied in the first direction.

According to the embodiments, a mask support frame for avoiding or minimizing generation of a wave in a width direction of a mask by a tensile force applied in a length direction of the mask is provided, and a mask assembly including the same is also provided.

DETAILED DESCRIPTION

Figure 1:
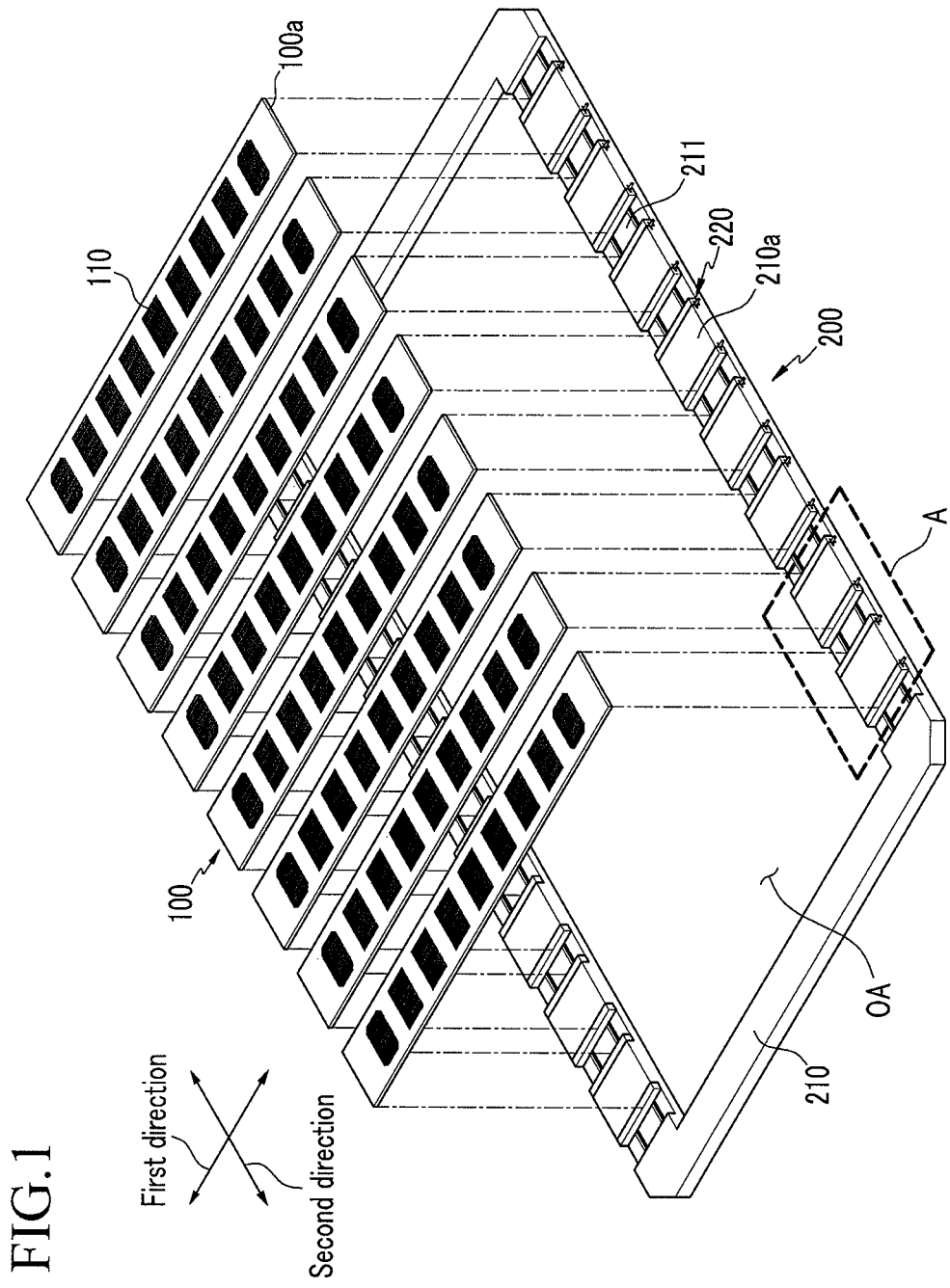
FIG. 1 shows a perspective view of a mask assembly according to a first embodiment.

Embodiments will be described more fully hereinafter with reference to the accompanying drawings. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

In addition, a configuration having the same components denoted by the same reference numerals will be representatively described in a first embodiment of various embodiments, and other components that are different from the first embodiment will be described in other embodiments.

In addition, the size and thickness of each component shown in the drawings are arbitrarily shown for understanding and ease of description, but the present invention is not limited thereto.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element and does not imply being necessarily positioned on the top on the basis of a gravity direction.

In embodiments, a mask assembly includes a mask support frame including an opening part and a plurality of masks in a band shape. Both ends of each mask are fixed to the frame.

When tension or tensile force is applied to the mask in a length direction of the mask, and the mask supported by the frame may be deformed to have waves unintentionally generated in a width direction of the mask. The waves may be caused by the tension applied to the mask in the length direction. Thus, in embodiments, tension in the width direction may be applied to the mask at the end thereof to minimize such wave-shaped deformation.

A mask assembly according to a first embodiment will now be described with reference to FIG. 1 to FIG. 3.

FIG. 1 shows a perspective view of a mask assembly according to a first embodiment.

As shown in FIG. 1, the mask assembly according to the first embodiment includes a plurality of masks 100 and a mask support frame 200.

The mask 100 has a band shape elongated in a first direction, a length direction, and both ends 100a are attached to and supported by the frame 200 while the tensile force or tension is applied in the first direction. In embodiments, a plurality of masks 100 are disposed on the frame 200, neighbor each other, and arranged in a second direction, a width direction of the mask 100, crossing and generally perpendicular to the first direction. Both ends 100a of the mask 100 are formed to be flat, but not limited thereto. In alternative embodiments, they can be formed to have a horseshoe shape.

The mask 100 includes a plurality of patterns 110.

The plurality of patterns 110 are disposed and arranged in the first direction on the mask 100. Each pattern 110 can correspond to an organic light emitting diode (OLED) display. In embodiments, patterns for configuring organic light emitting diode (OLED) displays can be formed on a mother substrate on which the organic light emitting diode (OLED) displays will be manufactured through a single process by using the mask 100. That is, the patterns 110 are disposed on the mask 100 corresponding to a deposition area of the patterns for configuring the organic light emitting diode (OLED) display. The pattern 110 has a plurality of openings for through which depositing material can pass. Thus, the patterns configuring the organic light emitting diode (OLED) display may be formed on a mother substrate through the patterns 110. In embodiments, the pattern 110 includes a plurality of stripe-type slits.

The frame 200 fixes and supports both ends 100a of the masks 100 to which the tensile force is applied in the first direction. Therefore, since force may be applied in the first direction, an elongation direction of the mask 100, the mask can be formed with a metallic material such as stainless steel with great rigidity so that it may not be deformed by the force of the mask 100 of the frame 200.

Figure 2:
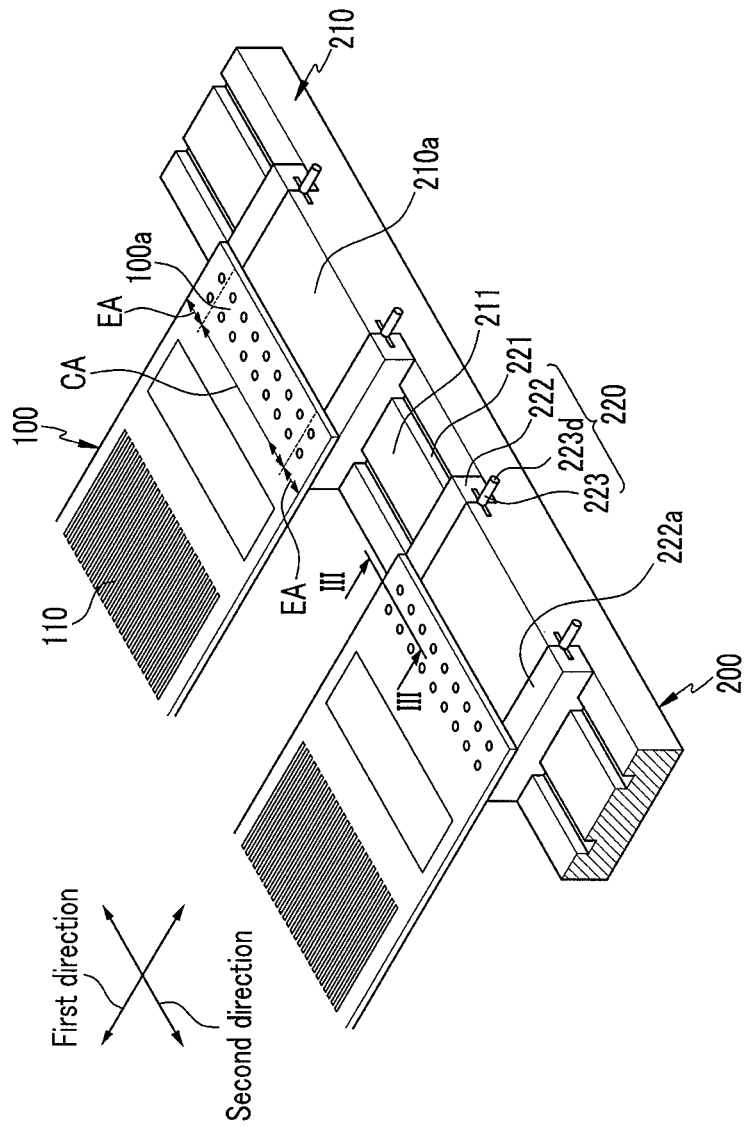
FIG. 2 shows a part A of FIG. 1.

FIG. 2 shows a part A of FIG. 1. FIG. 3 shows a cross-sectional view with respect to a line of FIG. 2.

Figure 3:
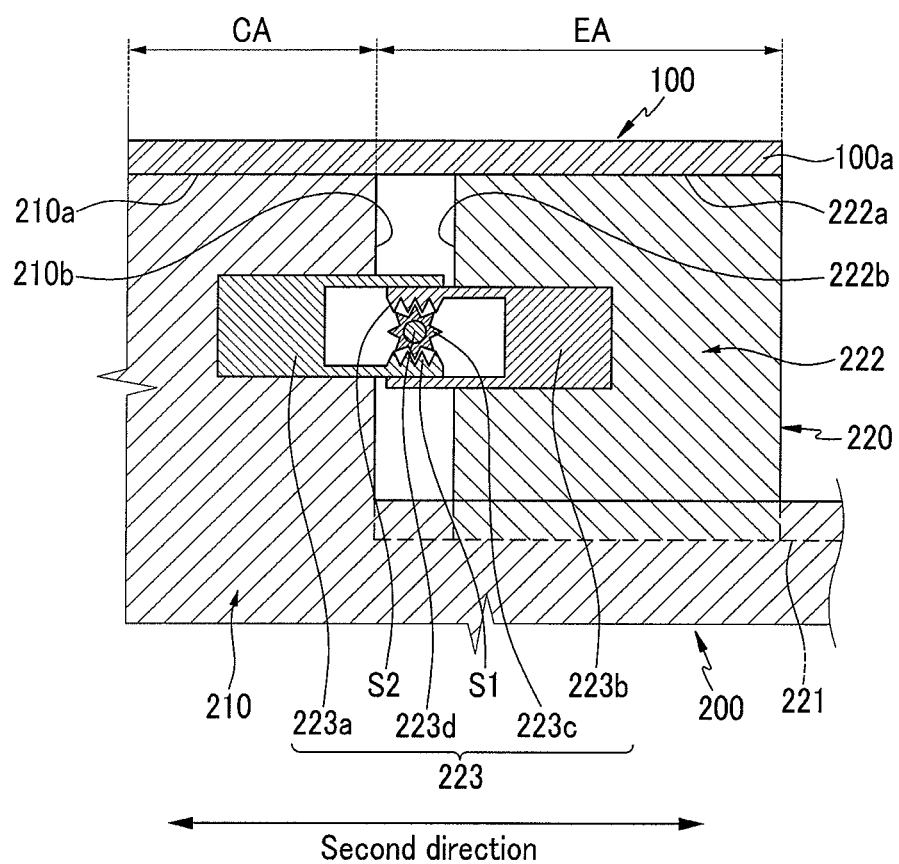
FIG. 3 shows a cross-sectional view with respect to a line of FIG. 2.

As shown in FIG. 2 and FIG. 3, the frame 200 includes a frame main body 210 and an end tensioner 220.

The frame main body 210 has a closed loop shape and defines an opening (OA) for exposing the patterns 110 of the mask 100. One end 100a of the mask 100 includes a central or center area (CA) and two peripheral areas (EA) arranged in the second direction such that the central area (CA) is interposed between the peripheral areas (EA). The center area (CA) is welded on a surface of a mask seat 210a of the frame main body 210. The frame main body 210 includes a depression or sunk portion 211 disposed between two neighboring mask seats 210a.

In embodiments, the mask seats 210a are formed as elevated ridge structures. In other embodiments, the depressions 211 are formed as portions sunk from the surface 210a of the frame main body 210.

The end tensioner 220 is provided in the depression 211, is movably coupled to the frame main body 210, and applies tension to the end 100a of the mask 100 in the second direction crossing the first direction. A peripheral area (EA) of the end 100a of the mask 100 in the second direction is welded to the end tensioner 220. In embodiments, the end tensioner 220 includes a slider 222, and a tension adjustor 223 and the frame main body 210 includes a slide guide 221.

In embodiments, the slide guide 221 is formed in the form of a groove on the surface of the depression 211 and extends in the second direction.

The slider 222 is installed in the slide guide 221 and slides in the second direction, and the peripheral area (EA) of the end 100a of the mask 100 in the second direction is welded on a surface 222a of the slider 222. Therefore, when the slider 222 slides in the second direction, the tensile force in the second direction is generated at the end 100a of the mask 100.

In embodiments, the tension adjustor 223 can adjust a sliding of the slider 222 in the second direction, and then the amount of the tension in the second direction. As such, the tensile force generated at the end 100a of the mask 100 in the second direction is adjusted by the tension adjustor 223. The tension adjustor 223 includes a first rack 223a, a second rack 223b, a pinion 223c, and a rotation shaft 223d. The first rack 223a is overlapped on the second rack 223b.

The first rack 223a is installed on a side wall 210b of the mask seat 210a of the frame main body 210 forming the depression 211 and protrudes toward a side wall 222b of the slider 222, and has first teeth S1 is formed in it. In embodiments, the first rack 223a has a "C" or "⊏" shape, and without being restricted to this. The first rack 223a according to another embodiment can have various shapes such as "—," "T," or "⊥."

A part of the second rack 223b is overlapped with the first rack 223a.

The second rack 223b is installed on the side wall 222b of the slider 222 facing the side wall 210b of the frame main body 210, and protrudes toward the side wall 210b of the frame main body 210 so that it may overlap the first rack 223a, and has second teeth S2 corresponding to the first teeth S1. In embodiments, the second rack 223b has a "C" or "⊏" shape, and without being restricted to this. The second rack 223b according to another embodiment can have various shapes such as "—," "T," or "⊥."

The pinion 223c and the rotation shaft 223d are provided between the second rack 223b and the first rack 223a.

The pinion 223c is engaged with the first teeth S1 and the second teeth S2 and interposed between the first teeth S1 and the second teeth S2.

The rotation shaft 223d is combined with the center of the pinion 223c and protrudes outside the frame main body 210. The rotation shaft 223d can be rotated while being supported by the frame main body 210. When the rotation shaft 223d is rotated, the pinion 223c is rotated. Since the rotation shaft 223d is protruded outside the frame main body 210, the rotation shaft 223d is rotated so that the pinion 223c may be easily rotated.

Accordingly, when the rotation shaft 223d of the tension adjustor 223 is rotated in a clockwise direction or a counter-clockwise direction to rotate the pinion 223c in the clockwise direction or the counterclockwise direction, the first rack 223a at which the first teeth S1 combined with the pinion 223c and the second rack 223b at which the second teeth S2 are formed move in the opposite directions to each other along the second direction to adjust the sliding degree of the slider 222 in the second direction. Thus, the tensile force in the second direction applied to the end 100a of the mask 100 can be adjusted.

The sliding degree of the above-described slider 222 in the second direction is controlled by the tension adjustor 223, and without being restricted to this, the sliding degree of the slide according to another embodiment in the second direction is controllable by various modified configurations.

Also, in embodiments, the end tensioner 220 includes the slider 222, and the tension adjustor 223, and the frame main body 210 includes the slide guide 221, without being restricted to this. The end tensioner and the frame main body according to another embodiment can include various constituent elements such that the end tensioner can apply tension to the end of the mask in the second direction crossing the first direction.

As described regarding the mask assembly according to the first embodiment, the frame 200 which can apply tension to both ends 100a of the masks 100 in the first direction, the length direction of the mask 100 can include the end tensioner 220 for tensioning the ends 100a of the mask 100 in the second direction, the width direction of the mask 100, thereby minimizing undesired generation of waves on the mask 100 in the second direction by the tensile force applied in the first direction.

Further, the mask assembly according to the first embodiment uses the tension adjustor 223 to control the sliding degree of the slider 222 of the end tensioner 220 in the second direction, so it can eliminate the waves generated on the mask 100 by controlling the sliding degree of the slider 222 by using the tension adjustor 223 when the waves are generated on the mask 100 in the second direction, which functions as a factor for solving the wave of the mask 100 that is generated by unexpected problems at the spot where the mask assembly is used.

A mask assembly according to a second embodiment will now be described with reference to FIG. 4 and FIG. 5.

Parts that are different from the first embodiment will be described, and other parts that are not described follow the first embodiment. For better comprehension and ease of description, the same constituent elements in the second embodiment will have the same reference numerals as in the first embodiment.

Figure 4:
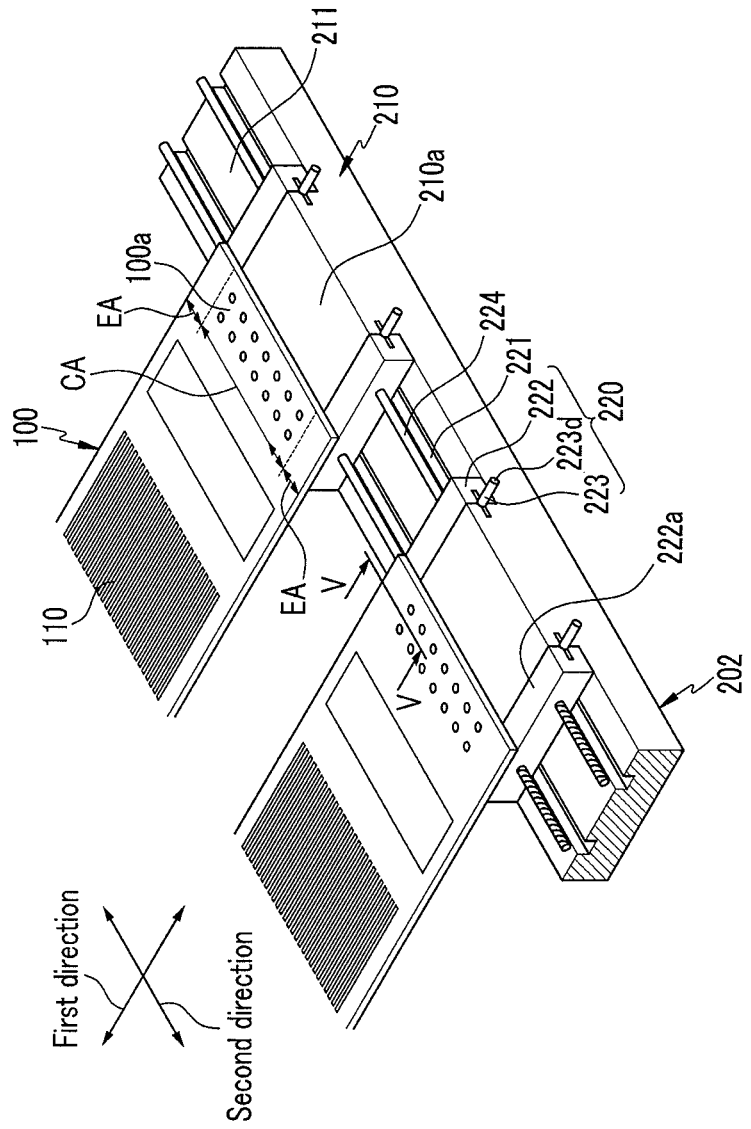
FIG. 4 shows a part of a mask assembly according to a second embodiment.

FIG. 4 shows a part of a mask assembly according to a second embodiment. FIG. 5 shows a cross-sectional view with respect to a line V-V of FIG. 4.

Figure 5:
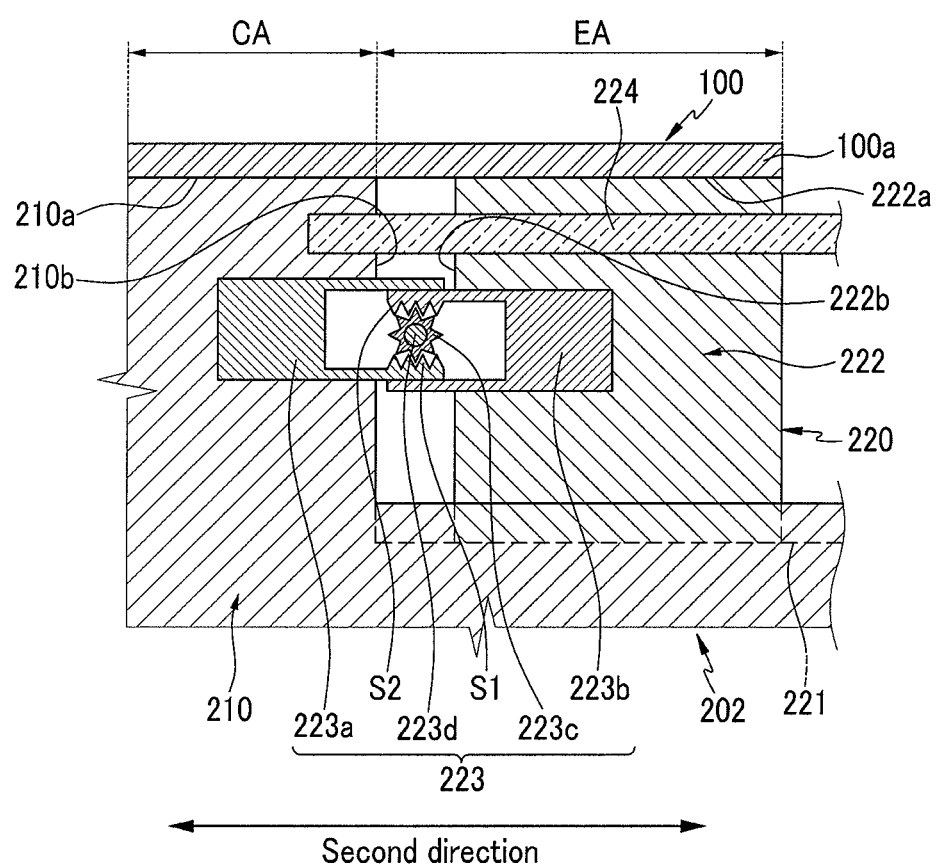
FIG. 5 shows a cross-sectional view with respect to a line V-V of FIG. 4.

As shown in FIG. 4 and FIG. 5, an end tensioner 220 of a frame 202 of the mask assembly according to the second embodiment includes a slider 222, a tension adjustor 223, and a separation preventing shaft 224, and the frame main body 210 includes a slide guide 221.

The separation preventing shaft 224 connects a space between both side walls 210b of the frame main body 210 in the second direction. Since the separation preventing shaft 224 extends through the slider 222 and connects the space between the side walls 210b of the frame main body 210, separation of the slider 222 from the slide guide 221 is prevented when the slider 222 slides in the second direction.

Accordingly, the mask assembly according to the second embodiment includes the separation preventing shaft 224 to prevent the slider 222 from being separated from the slide guide 221. Therefore, when the slider 222 slides in the second direction, the reliability of the device is improved.

While this disclosure has been described in connection with what is presently considered to be embodiments, it is to be understood that the invention is not limited to the disclosed embodiments, but, on the contrary, is intended to cover various modifications and equivalent arrangements included within the spirit and scope of the appended claims.

What is claimed is:

1. A mask support frame for supporting a first unit mask comprising a first end portion and a second end portion, which are to be secured to the mask support frame, the frame comprising:
    a frame main body comprising a first frame member and a second frame member that extend in a first direction, the frame main body defining an opening interposed between the first and second frame members, wherein the first frame member is for being welded to the first unit mask at a A first spot of the first end portion, and the second frame member is for being welded to the A second end portion of the first unit mask, such that the first unit mask extends in a second direction crossing the first direction;
    a slider slidably engaged with the first frame member and configured to slide in the first direction, wherein the slider is for being welded to the first unit mask at a second spot of the first end portion that is distanced from the first spot in the first direction; and
    a tension adjuster configured to adjust the distance between the first spot and the second spot in the first direction when the first unit mask is welded to the first frame member at the first spot and further welded to the slider at the second spot.

2. The frame of claim 1, wherein the frame is configured to secure additional unit masks such that the additional unit masks and the first unit mask are disposed side by side.

3. The frame of claim 2, wherein
    the first frame member comprises a first mask seat for being welded to the first unit mask, a second mask seat for being welded to a second unit mask neighboring the first unit mask, and a depression provided between the first and second mask seats, and the slider is provided in the depression.

4. A mask support frame for supporting at least one mask, the frame being configured to secure both ends of the at least one mask and apply tension to the at least one mask in a first direction, the frame comprising
    a frame main body defining an opening for exposing a patterned opening area of the at least one mask; and
    an end tensioner coupled to the frame main body, and configured to apply tension to one of the both ends of the at least one mask in a second direction crossing the first direction,
    wherein the frame is configured to secure multiple masks including the at least one mask such that the multiple masks are disposed side by side and arranged in the second direction, wherein the frame main body comprises mask seats, each of which is configured to couple to an end an individual one of the multiple masks, and a depression provided between two neighboring mask seats, and the end tensioner is provided in the depression, wherein the frame main body comprises a slide guide formed in the depression and extending in the second direction, and the end tensioner comprises a slider engaged with the slide guide, configured to slide in the second direction, and further configured to be coupled to the at least one mask.

5. The frame of claim 4, further comprising a separation prevention shaft extending through the slider in the second direction and connected to the frame main body.

6. The frame of claim 4, further comprising a tension adjustor configured to adjust the amount of tension in the second direction.

7. The frame of claim 6, wherein the tension adjuster comprises:

a first rack coupled to the frame main body, extending in the second direction, and comprising first teeth;

a second rack coupled to the slider opposing the first rack, and second teeth;

a pinion engaged with the first teeth and the second teeth and located between the first teeth and the second teeth; and a rotation shaft fixed to the pinion and protruding outside the frame main body.

8. The frame of claim 4, wherein each of the both ends of the at least one mask comprises a central area and two peripheral areas arranged in the second direction such that the central area is interposed between the peripheral areas, wherein the central area is configured to be attached to a mask seat of the frame main body, wherein one of the peripheral areas is configured to be attached to the end tensioner.

9. A mask assembly comprising:

the mask support frame of claim 1; and at least one unit mask comprising two ends secured with the frame main body with tension applied in the first direction.

* * * * *

UNITED STATES PATENT AND TRADEMARK OFFICE
CERTIFICATE OF CORRECTION

| | | |
|---|---|---|
| PATENT NO. | : 9,141,001 B2 | Page 1 of 1 |
| APPLICATION NO. | : 13/786863 | |
| DATED | : September 22, 2015 | |
| INVENTOR(S) | : Yong-Hwan Kim | |

It is certified that error appears in the above-identified patent and that said Letters Patent is hereby corrected as shown below:

In the Claims

In column 6 at line 29 in Claim 1, change "a A" to --a--.

In column 6 at line 30 in Claim 1, change "the A" to --the--.

In column 7 at line 2 in Claim 4, change "end an" to --end of an--.

Signed and Sealed this
Thirty-first Day of May, 2016

Michelle K. Lee
*Director of the United States Patent and Trademark Office*